US007382207B2

(12) United States Patent
Yamamoto

(10) Patent No.: US 7,382,207 B2
(45) Date of Patent: Jun. 3, 2008

(54) OSCILLATOR CIRCUIT SUPPRESSING VARIATION OF OSCILLATION FREQUENCY

(75) Inventor: Masaki Yamamoto, Fukushima-ken (JP)

(73) Assignee: Alps Electric Co., Ltd., Tokyo (JP)

( * ) Notice: Subject to any disclaimer, the term of this patent is extended or adjusted under 35 U.S.C. 154(b) by 35 days.

(21) Appl. No.: 11/385,169

(22) Filed: Mar. 20, 2006

(65) Prior Publication Data
US 2006/0232350 A1    Oct. 19, 2006

(30) Foreign Application Priority Data
Apr. 13, 2005  (JP) .............. 2005-115708

(51) Int. Cl.
*H03L 7/099* (2006.01)
(52) U.S. Cl. .............. 331/185; 331/36 C; 331/176; 331/177 V; 331/186
(58) Field of Classification Search .......... 331/185, 331/186, 36 C, 176, 177 V
See application file for complete search history.

(56) References Cited

U.S. PATENT DOCUMENTS

| 5,805,028 A | 9/1998 | Kato |
| 6,882,237 B2* | 4/2005 | Singh et al. ............ 331/185 |
| 6,927,643 B2* | 8/2005 | Lazarescu et al. .......... 331/186 |
| 7,005,936 B2* | 2/2006 | Tanzawa ................. 331/176 |
| 7,019,598 B2* | 3/2006 | Duncan et al. ............ 331/176 |
| 2004/0189412 A1 | 9/2004 | Kato |

FOREIGN PATENT DOCUMENTS

| EP | 0 352 695 A2 | 1/1990 |
| JP | 60-165804 | 8/1985 |
| JP | 7-22840 | 1/1995 |
| JP | 2004-172934 | 6/2004 |

OTHER PUBLICATIONS

European Search Report dated Oct. 25, 2006 from corresponding European Application No. 06007398.8-1233.

* cited by examiner

*Primary Examiner*—Benny Lee
*Assistant Examiner*—Levi Gannon
(74) *Attorney, Agent, or Firm*—Beyer Law Group LLP

(57) ABSTRACT

An oscillator circuit includes: oscillating transistors; a resonance circuit that includes varactor diodes each having a cathode to which a control voltage for controlling an oscillation frequency is applied and that is coupled between a collector and a base of each of the oscillating transistors; and a bias power supply that applies the bias voltages to the anodes of the varactor diodes. The bias voltages are given negative temperature characteristics, and a variation in the oscillation frequency caused by a change in the capacitance values of the varactor diodes due to a temperature variation is corrected by varying the bias voltages corresponding to the temperature variation.

7 Claims, 2 Drawing Sheets

OSCILLATOR CIRCUIT SUPPRESSING VARIATION OF OSCILLATION FREQUENCY

BACKGROUND OF THE INVENTION

1. Field of the Invention

The present invention relates to an oscillator circuit used for local oscillation of, for example, a television tuner.

2. Description of the Related Art

FIG. 4 shows an oscillator circuit 1 according to the related art that is used, for example, for a low or high band of a VHF television tuner. The oscillator circuit 1 includes first and second oscillating transistors 2 and 3 provided in an integrated circuit 20 and a resonance circuit 4 provided outside the integrated circuit 20. Emitters of the first and second oscillating transistors 2 and 3 are connected to each other and are connected to a constant current source 5. Further, a collector of the first oscillating transistor 2 is connected to a power supply terminal B of the integrated circuit 20, and a collector of the second oscillating transistor 3 is connected to the power supply terminal B through a feeding resistor 6. Furthermore, the collector of the first oscillating transistor 2 and the base of the second oscillating transistor 3 are respectively connected in a high-frequency wise to a common ground point in the integrated circuit 20 by a first DC cutting capacitor 7 and a second DC cutting capacitor 8 which are provided in the integrated circuit 20.

Therefore, the first and second oscillating transistors 2 and 3 are differentially connected to each other, and the base of the first oscillating transistor 2 and the collector of the second oscillating transistor 3 are similar to each other in phase.

The integrated circuit 20 is provided with a terminal 20a. Further, first and second coupling capacitors 9 and 10 are provided in the integrated circuit 20. The base of the first oscillating transistor 2 is connected to the terminal 20a through the first coupling capacitor 9, and the collector of the second oscillating transistor 3 is connected to the terminal 20a through the second coupling capacitor 10. The resonance circuit 4 has an inductance element 4a, a varactor diode 4b, etc. One end of the resonance circuit is connected to the terminal 20a, and the other end of the resonance circuit is grounded outside of the integrated circuit 20.

Therefore, the oscillator circuit 1 forms an unbalanced oscillator circuit. An oscillation frequency is set on the basis of a tuning voltage Tu to be applied to the varactor diode 4b (for example, see JP-A-2004-172934 (FIG. 1)).

The varactor diode 4b of the resonance circuit 4 has a capacitance value with a positive temperature coefficient. Therefore, the resonance frequency of the resonance circuit has a negative temperature coefficient so as to decrease as temperature rises. In particular, when the voltage between both ends of the varactor diode is low, the capacitance value increases, and thus the frequency varies over a wide range.

SUMMARY OF THE INVENTION

It is an object of the invention is to suppress a variation in an oscillation frequency due to a change of the capacitance value of a varactor diode depending on temperature.

According to a first aspect of the invention, an oscillator circuit includes: an oscillating transistor; a resonance circuit that includes varactor diodes each having a cathode to which a control voltage for controlling an oscillation frequency is applied and that is coupled between a collector and a base of the oscillating transistor; and a bias power supply that applies a bias voltage to an anode of the varactor diode. The bias voltage has a negative temperature coefficient.

According to a second aspect of the invention, preferably, the absolute value of the negative temperature coefficient increases when the control voltage is equal to or higher than a predetermined value. Preferably, the absolute value of the negative temperature coefficient decreases when the control voltage is lower than the predetermined value.

According to a third aspect of the invention, preferably, the bias power supply includes: a first resistor whose resistance value has a first positive temperature coefficient; a second resistor whose resistance value has a second positive temperature coefficient smaller than the first positive temperature coefficient; and a third resistor whose resistance value has a third positive temperature coefficient smaller than the first positive temperature coefficient and larger than the second positive temperature coefficient. Preferably, one end of each of the first and third resistors is pulled up to a power supply voltage. One end of the second resistor is grounded, and the other end of the second resistor is connected to the anode of the varactor diode. The other end of the first resistor is connected to the other end of the second resistor when the control voltage is equal to or higher than a predetermined value. The other end of the third resistor is connected to the other end of the second resistor when the control voltage is lower than the predetermined value.

According to a fourth aspect of the invention, preferably, the bias power supply includes: a first switching transistor which is interposed between the other end of the first resistor and the other end of the second resistor; and a second switching transistor which is interposed between the other end of the third resistor and the other end of the second resistor. Preferably, only the first switching transistor is turned on when the control voltage is equal to or higher than the predetermined value. In addition, preferably, only the second switching transistor is turned on when the control voltage is lower than the predetermined value.

According to a fifth aspect of the invention, preferably, the bias power supply includes: a first resistor whose resistance value has a first positive temperature coefficient; a second resistor whose resistance value has a second positive temperature coefficient smaller than the first positive temperature coefficient; and a fourth resistor. Preferably, one end of each of the first and fourth resistors is pulled up to a power supply voltage. One end of the second resistor is grounded, and the other end of the second resistor is connected to the other end of the first resistor and is also connected to the anode of the varactor diode. When the control voltage is equal to or higher than a predetermined value, the other end of the fourth resistor is disconnected. When the control voltage is lower than the predetermined value, the fourth resistor is connected in parallel to the first resistor. The temperature coefficient of the combined resistance value of the first and fourth resistors connected in parallel to each other is set to be larger than the first positive temperature coefficient and smaller than the second positive temperature coefficient.

According to a sixth aspect of the invention, preferably, the other end of the fourth resistor is connected to a connection point between the first and second resistors through a third switching transistor. The third switching transistor is turned off when the control voltage is equal to or higher than the predetermined value, and is turned on when the control voltage is lower than the predetermined value.

According to a seventh aspect of the invention, preferably, the oscillating transistor, the bias power supply, and a switching control circuit that turns on or off the first to third switching transistors are provided in an integrated circuit. Preferably, frequency data of a receiving channel is input to the switching control circuit, and the switching control circuit turns on or off the first to third switching transistors on the basis of whether most significant bit data of the frequency data is 1 or 0.

DESCRIPTION OF THE PREFERRED EMBODIMENT

Figure 1:
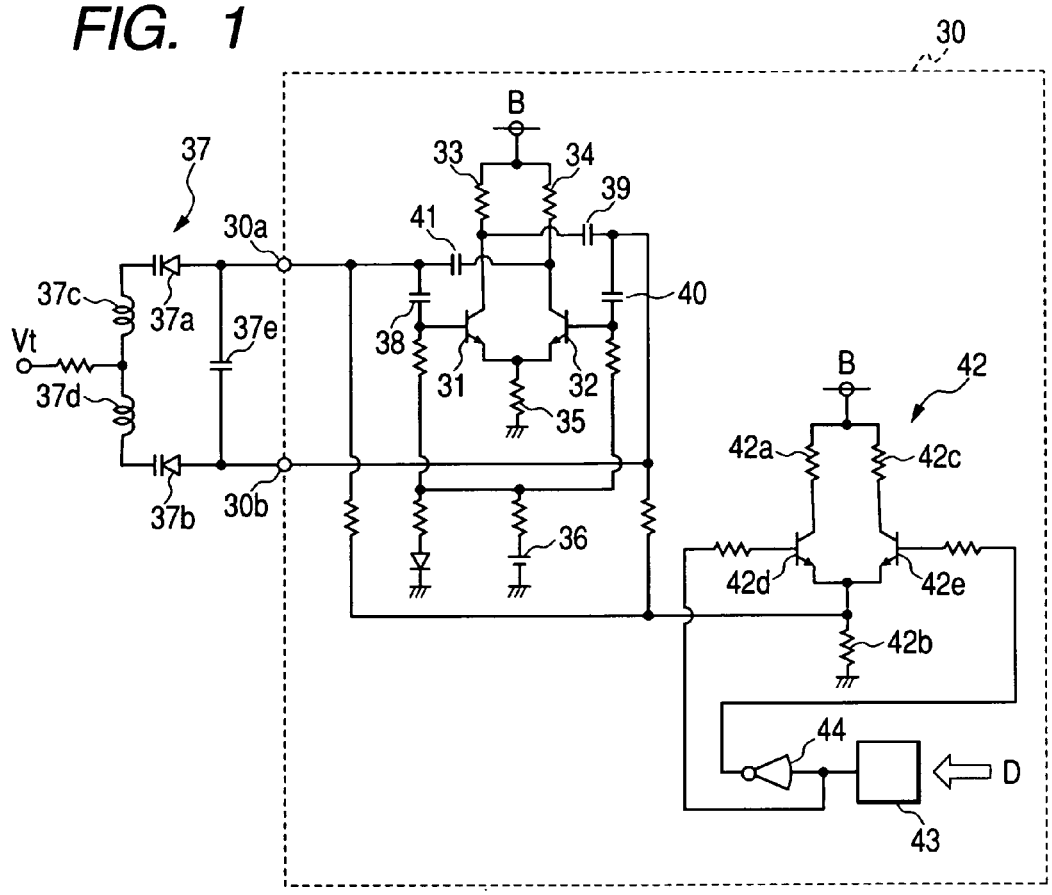
FIG. 1 is a circuit diagram showing the configuration of an oscillator circuit according to the invention.

An oscillator circuit according to the invention will now be described with reference to FIG. 1. Oscillating transistors 31 and 32 provided in an integrated circuit 30 are differentially connected to each other, and the collectors of the oscillating transistors 31 and 32 are pulled up to a power supply B through resistors 33 and 34, respectively. For the differential connection, the emitters of the oscillating transistors are grounded through a common resistor 35. A bias voltage is applied from a bias power supply 36 to the base of each of the oscillating transistors. Then, a resonance circuit 37 provided outside the integrated circuit 30 is coupled with the oscillating transistors 31 and 32.

The resonance circuit 37 has two varactor diodes 37a and 37b, two inductance elements 37c and 37d connected in series to each other between the cathodes of the varactor diodes, and a capacitive element 37e connected between the anodes of the two varactor diodes 37a and 37b. A control voltage Vt for varying the oscillation frequency is applied to a connection point between the two inductance elements 37c and 37d. The anodes of the varactor diodes 37a and 37b are coupled between the collector and the base of the oscillating transistor 31 through external connection terminals 30a and 30b of the integrated circuit 30 and are also coupled between the collector and the base of the oscillating transistor 32. In this way, a balanced oscillator circuit is formed.

That is, the anode of the varactor diode 37a is coupled with the base of the oscillating transistor 31 through a coupling capacitor 38, and the anode of the varactor diode 37b is coupled with the collector of the oscillating transistor 31 through a coupling capacitor 39. Similarly, the anode of the varactor diode 37b is coupled with the base of the oscillating transistor 32 through a coupling capacitor 40, and the anode of the varactor diode 37a is coupled with the collector of the oscillating transistor 32 through a coupling capacitor 41.

The capacitance values of the varactor diodes 37a and 37b depend on temperature. That is, the capacitance values increase as temperature rises. In other words, the varactor diodes 37a and 37b each have a positive temperature coefficient. Therefore, the resonance frequency of the resonance circuit 37 (accordingly, the oscillation frequency) has a negative temperature coefficient. Further, when the control voltage applied to the cathodes of the varactor diodes 37a and 37b is lowered to cause the capacitance values of the varactor diodes 37a and 37b to increase, the variation width of the oscillation frequency becomes wider. For this reason, in this invention, a bias power supply 42 of which the voltage varies depending on temperature is provided in the integrated circuit 30 and bias voltages are applied from the bias power supply 42 to the anodes of the varactor diodes 37a and 37b, thereby improving the temperature dependence of the oscillation frequency. The improvement of the temperature dependence of the oscillation frequency by the bias power supply 42 will be described below.

First, the bias power supply 42 is composed of a first resistor 42a and a third resistor 42c each having one end pulled up to the power supply B, a second resistor 42b having one end connected to the ground, a first switching transistor 42d interposed between the other end of the first resistor 42a and the other end of the second resistor 42b, and a second switching transistor 42e interposed between the other end of the third resistor 42c and the other end of the second resistor 42b. The anodes of the varactor diodes 37a and 37b are connected to the other end of the second resistor 42b. Further, the first switching transistor 42d or the second switching transistor 42e is switched to be turned on. Therefore, the bias voltage divided by the first resistor 42a and the second resistor 42b or by the third resistor 42c and the second resistor 42b is applied to the anodes of the varactor diodes 37a and 37b. The bias voltage is approximately 0.2 V.

Here, the resistance value of the first resistor 42a has a temperature coefficient of about 1200 PPM/° C. (a first positive temperature coefficient). The resistance value of the second resistor 42b has a temperature coefficient of about 150 PPM/° C. (a second positive temperature coefficient) The resistance value of the third resistor 42c has a temperature coefficient of about 700 PPM/° C. (a third positive temperature coefficient).

Since the first to third resistors 42a to 42c have the above-mentioned temperature coefficients, the bias voltages have negative temperature coefficients. For this reason, when temperature rises up, the capacitance values of the varactor diodes 37a and 37b increase and accordingly, the oscillation frequency decreases. However, since the bias voltage of the anodes varies to be lowered, the voltage between both ends of each of the varactor diodes 37a and 37b increases, so that an increase in the capacitance values is suppressed, which results in little variation in the oscillation frequency.

Figure 2:
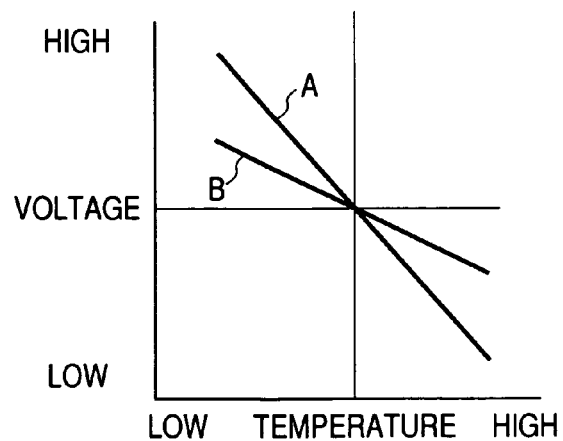
FIG. 2 is a graph showing temperature characteristics of a bias power supply used for the oscillator circuit according to the invention.

Further, the absolute value of the temperature coefficient of the bias voltage when the first switching transistor 42d is turned on is larger than the absolute value of the temperature coefficient of the bias voltage when the second switching transistor 42e is turned on. Therefore, according to the variation characteristics of the bias voltages with regard to temperature, a gradient A of the bias voltage when the first switching transistor 42d is turned on is steeper than a gradient B of the bias voltage when the second switching transistor 42e is turned on, as shown in FIG. 2.

Meanwhile, the control voltage applied to the cathodes of the varactor diodes 37a and 37b is in the range of about 0.5 V to 2.5 V. When the control voltage is high (when the oscillation frequency is high), the capacitance values become small, and accordingly, the variation rate of the capacitance values with regard to the control voltages becomes small. On the other hand, when the control voltage is low (when the oscillation frequency is low), the capacitance values become large and accordingly, the variation rate of the capacitance values with regard to the control voltages becomes large.

In a case in which the control voltage equal to or higher than a predetermined value is applied to the cathodes of the varactor diodes such that the oscillation frequency is high, if the bias voltage when the first switching transistor 42d is turned on is applied to the anodes of the varactor diodes 37a and 37b, the bias voltage varies over a wide range, which makes it possible to easily correct the oscillation frequency with respect to temperature and thus to widen the correction range. Further, in a case in which the control voltage lower than the predetermined value is applied to the cathodes of the varactor diodes such that the oscillation frequency is low, if the bias voltage when the second switching transistor 42d is turned on is applied to the anodes of the varactor diodes 37a and 37b, the variation range of the bias voltages can be narrowed, which makes it possible to prevent the excessive temperature correction of the oscillation frequency and to widen the correction range.

Further, a switching control circuit 43 and an inverter 44 are provided in the integrated circuit 30 in order to turn on or off the first and second switching transistors 42d and 42e. Frequency data D of a receiving channel is input to the switching control circuit 43. The frequency data D is, for example, 10-bit data. When the frequency of the receiving channel increases, the significant bit data sequentially vary from 0 to 1. Therefore, it is possible to determine whether the frequency of the receiving channel is high or low by considering only whether the most significant bit data is 0 or 1.

The switching control circuit 43 outputs a low switching voltage when the most significant bit data of the frequency data is 0, and outputs a high switching voltage when the most significant bit data is 1. The low switching voltage makes the first switching transistor 42d off, and the second switching transistor 42e it turned on by the switching voltage applied through the inverter 44. Meanwhile, the high switching voltage makes the first switching transistor 43d on, and thus the second switching transistor 42e is turned off. That is, when a channel having a frequency lower than that of a predetermined channel is received (accordingly, the control voltage applied to the varactor diodes 37a and 37b is lower than a predetermined value), the second switching transistor 42e is turned on. On the other hand, when a channel having a frequency higher than that of the predetermined channel is received (accordingly, the control voltage applied to the varactor diodes 37a and 37b is higher than the predetermined value), the first switching transistor 42d is turned on.

Figure 3:
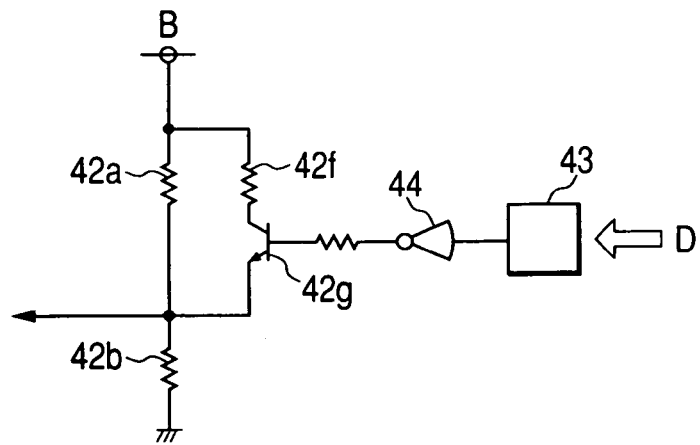
FIG. 3 is a circuit diagram showing the configuration of another bias power supply used for the oscillator circuit according to the invention.
Figure 4:
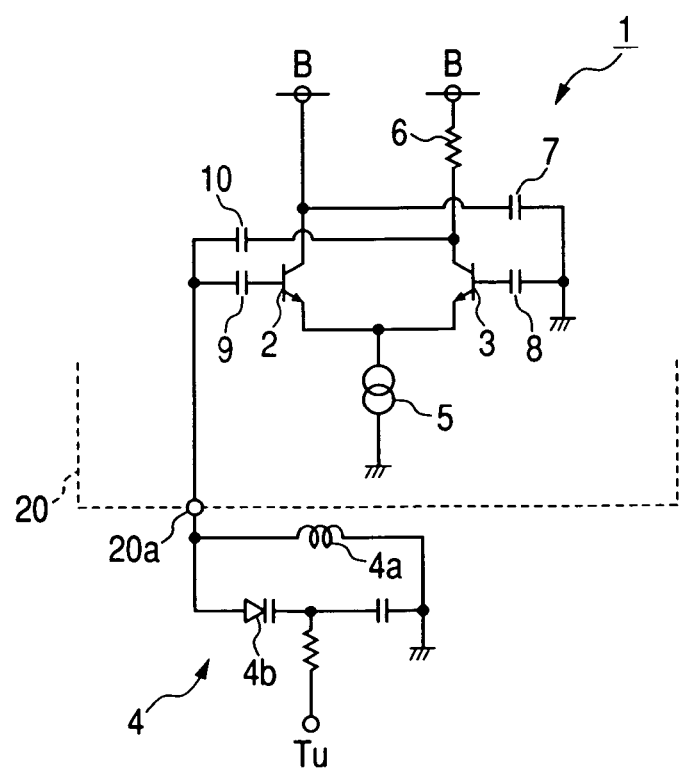
FIG. 4 is a circuit diagram showing the configuration of an oscillator circuit according to the related art.

FIG. 3 shows another configuration of the bias power supply 42. The first resistor 42a and a fourth resistor 42f each have one end pulled up to the power supply B. One end of the second resistor 42b is grounded. The other end of the first resistor 42a is connected to the other end of the second resistor 42b, and the anodes of the varactor diodes 37a and 37b are connected to a connection point between the first and second resistors. The other end of the fourth resistor 42f is connected to the connection point between the first and second resistors 42a and 42b through a third switching transistor 42g. The third switching transistor 42g is turned off when a control voltage is equal to or higher than a predetermined value, and is turned on when the control voltage is lower than the predetermined value, so that the first resistor 42a and the forth resistor 42f are connected in parallel to each other. A switching control voltage is applied to the third switching transistor 42g through the switching control circuit 43 and the inverter 44.

It is preferable to set the temperature coefficient of the combined resistance value of the first and fourth resistors 42a and 42g connected in parallel to each other so as to be equal to that of the third resistor 42c shown in FIG. 1. In this way, one switching transistor is enough for this circuit structure.

Further, the first resistor 42a and the third resistor 42c each having a large temperature coefficient are composed of diffused resistors, and the second resistor 42b is composed of a polysilicon resistor. The fourth resistor 42f is composed of a diffused resistor or a polysilicon resistor. All the resistors may be formed in the same process as that in which the integrated circuit 30 is manufactured. The diffused resistor is formed by using a PN junction. In this case, a depletion layer is extended or compressed depending on temperature when a reverse bias is applied to the PN junction. Therefore, it is possible to form a resistor having a large temperature coefficient. Further, the polysilicon resistor is formed of silicon on a surface of an oxide film made of silicon, and thus has little change in a resistance value due to a temperature variation.

As described above, according to the first aspect of the invention, an oscillator circuit includes: an oscillating transistor; a resonance circuit that includes varactor diodes each having a cathode to which a control voltage for controlling an oscillation frequency is applied and that is coupled between a collector and a base of the oscillating transistor; and a bias power supply that applies a bias voltage to an anode of the varactor diode. The bias voltage has a negative temperature coefficient. According to this aspect, a variation in an oscillation frequency caused by a change in the capacitance value of the varactor diode due to temperature can be corrected by varying the bias voltage corresponding to temperature.

According to the second aspect of the invention, the absolute value of the negative temperature coefficient increases when the control voltage is equal to or higher than a predetermined value, and the absolute value of the negative temperature coefficient decreases when the control voltage is lower than the predetermined value. Therefore, when a control voltage equal to or higher than the predetermined value is applied to raise the oscillation frequency, the variation range of the bias voltage is widened. As a result, it is possible to easily perform the temperature correction of the oscillation frequency and to widen the correction range. Further, when a control voltage lower than the predetermined value is applied to lower the oscillation frequency, the variation range of the bias voltage is narrowed. As a result, it is possible to prevent the excessive temperature correction of the oscillation frequency and to widen the correction range.

According to the third aspect of the invention, the bias power supply includes: a first resistor whose resistance value has a first positive temperature coefficient; a second resistor whose resistance value has a second positive temperature coefficient smaller than the first positive temperature coefficient; and a third resistor whose resistance value has a third positive temperature coefficient smaller than the first positive temperature coefficient and larger than the second positive temperature coefficient. One end of each of the first and third resistors is pulled up to a power supply voltage. One end of the second resistor is grounded, and the other end of the second resistor is connected to the anode of the varactor diode. The other end of the first resistor is connected to the other end of the second resistor when the control voltage is equal to or higher than a predetermined value. The other end of the third resistor is connected to the other end of the second resistor when the control voltage is lower than the predetermined value. According to this aspect, it is possible to increase the temperature coefficient of the bias voltage when the control voltage is equal to or higher than the predetermined value. In addition, it is possible to decrease the temperature coefficient of the bias voltage when the control voltage is lower than the predetermined value.

According to the fourth aspect of the invention, the bias power supply includes: a first switching transistor which is interposed between the other end of the first resistor and the other end of the second resistor; and a second switching transistor which is interposed between the other end of the third resistor and the other end of the second resistor. In this structure, only the first switching transistor is turned on when the control voltage is equal to or higher than the predetermined value, and only the second switching transistor is turned on when the control voltage is lower than the predetermined value. According to this aspect, it is possible to obtain two bias voltages having different temperature coefficients by controlling the on or off state of the two switching transistors.

According to the fifth aspect of the invention, the bias power supply includes: a first resistor whose resistance value has a first positive temperature coefficient; a second resistor whose resistance value has a second positive temperature coefficient smaller than the first positive temperature coefficient; and a fourth resistor. In this structure, one end of each of the first and fourth resistors is pulled up to a power supply voltage. One end of the second resistor is grounded, and the other end of the second resistor is connected to the other end of the first resistor and is also connected to the anode of the varactor diode. When the control voltage is equal to or higher than a predetermined value, the other end of the fourth resistor is disconnected. When the control voltage is lower than the predetermined value, the fourth resistor is connected in parallel to the first resistor. In addition, the temperature coefficient of the combined resistance value of the first and fourth resistors connected in parallel to each other is set to be larger than the first positive temperature coefficient and smaller than the second positive temperature coefficient. According to this aspect, it is possible to increase the temperature coefficient of the bias voltage when the control voltage is equal to or higher than the predetermined value. In addition, it is possible to decrease the temperature coefficient of the bias voltage when the control voltage is lower than the predetermined value.

According to the sixth aspect of the invention, the other end of the fourth resistor is connected to a connection point between the first and second resistors through a third switching transistor. In addition, the third switching transistor is turned off when the control voltage is equal to or higher than the predetermined value, and is turned on when the control voltage is lower than the predetermined value. According to this aspect, it is possible to obtain two bias voltages having different temperature coefficients by controlling the on or off state of the two switching transistors.

According to the seventh aspect of the invention, the oscillating transistor, the bias power supply, and a switching control circuit that turns on or off the first to third switching transistors are provided in an integrated circuit. Further, frequency data of a receiving channel is input to the switching control circuit, and the switching control circuit turns on or off the first to third switching transistors on the basis of whether most significant bit data of the frequency data is 1 or 0. Therefore, it is possible to obtain bias voltages having different temperature coefficients by using frequency data for channel tuning.

The invention claimed is:

1. An oscillator circuit comprising:
an oscillating transistor;
a resonance circuit that includes varactor diodes each having a cathode to which a control voltage for controlling an oscillation frequency is applied and that is coupled between a collector and a base of the oscillating transistor; and
a bias power supply that applies a bias voltage to an anode of each of the varactor diodes,
wherein the bias voltage has a negative temperature coefficient, and
wherein the absolute value of the negative temperature coefficient increases when the control voltage is equal to or higher than a predetermined value, and the absolute value of the negative temperature coefficient decreases when the control voltage is lower than the predetermined value.

2. The oscillator circuit according to claim 1,
wherein the bias power supply includes:
a first resistor whose resistance value has a first positive temperature coefficient;
a second resistor whose resistance value has a second positive temperature coefficient smaller than the first positive temperature coefficient; and
a third resistor whose resistance value has a third positive temperature coefficient smaller than the first positive temperature coefficient and larger than the second positive temperature coefficient,
one end of each of the first and third resistors is pulled up to a power supply voltage,
one end of the second resistor is grounded, and the other end of the second resistor is connected to the anode of the varactor diode,
the other end of the first resistor is connected to the other end of the second resistor when the control voltage is equal to or higher than a predetermined value, and
the other end of the third resistor is connected to the other end of the second resistor when the control voltage is lower than the predetermined value.

3. The oscillator circuit according to claim 2, wherein the bias power supply includes:
a first switching transistor which is interposed between the other end of the first resistor and the other end of the second resistor; and
a second switching transistor which is interposed between the other end of the third resistor and the other end of the second resistor,
only the first switching transistor is turned on when the control voltage is equal to or higher than the predetermined value, and
only the second switching transistor is turned on when the control voltage is lower than the predetermined value.

4. The oscillator circuit according to claim 3,
wherein the oscillating transistor, the bias power supply, and a switching control circuit that turns on or off the first to third switching transistors are provided in an integrated circuit,
frequency data of a receiving channel is input to the switching control circuit, and
the switching control circuit turns on or off the first to third switching transistors on the basis of whether most significant bit data of the frequency data is 1 or 0.

5. The oscillator circuit according to claim 1,
wherein the bias power supply includes:
a first resistor whose resistance value has a first positive temperature coefficient;
a second resistor whose resistance value has a second positive temperature coefficient smaller than the first positive temperature coefficient; and
a fourth resistor,
one end of each of the first and fourth resistors is pulled up to a power supply voltage,
one end of the second resistor is grounded,
the other end of the second resistor is connected to the other end of the first resistor and is also connected to the anode of the varactor diode,
when the control voltage is equal to or higher than a predetermined value, the other end of the fourth resistor is disconnected,
when the control voltage is lower than the predetermined value, the fourth resistor is connected in parallel to the first resistor, and
the temperature coefficient of the combined resistance value of the first and fourth resistors connected in parallel to each other is set to be larger than the first positive temperature coefficient and smaller than the second positive temperature coefficient.

6. The oscillator circuit according to claim 5,
wherein the other end of the fourth resistor is connected to a connection point between the first and second resistors through a third switching transistor, and
the third switching transistor is turned off when the control voltage is equal to or higher than the predetermined value, and is turned on when the control voltage is lower than the predetermined value.

7. The oscillator circuit according to claim 6,
wherein the oscillating transistor, the bias power supply, and a switching control circuit that turns on or off the first to third switching transistors are provided in an integrated circuit,
frequency data of a receiving channel is input to the switching control circuit, and
the switching control circuit turns on or off the first to third switching transistors on the basis of whether most significant bit data of the frequency data is 1 or 0.

* * * * *